(12) United States Patent
Garrabrant et al.

(10) Patent No.: US 6,389,572 B1
(45) Date of Patent: May 14, 2002

(54) METHOD OF EXTRACTING BITS FROM MODULATED WAVEFORMS

(75) Inventors: Gary Walter Garrabrant, Seattle; Edward Joseph Vertatschitsch, Bellevue, both of WA (US)

(73) Assignee: Palm, Inc., Santa Clara, CA (US)

( * ) Notice: Subject to any disclaimer, the term of this patent is extended or adjusted under 35 U.S.C. 154(b) by 0 days.

(21) Appl. No.: 09/322,635

(22) Filed: May 28, 1999

(51) Int. Cl.[7] .......................... H03M 13/00; H04L 1/08
(52) U.S. Cl. ........................... 714/780; 714/821
(58) Field of Search .................. 714/752, 758, 714/780; 375/225, 229

(56) References Cited

U.S. PATENT DOCUMENTS

| | | | |
|---|---|---|---|
| 4,432,057 A | 2/1984 | Daniell et al. | 707/8 |
| 4,807,182 A | 2/1989 | Queen | 707/511 |
| 4,866,611 A | 9/1989 | Cree et al. | 708/112 |
| 4,875,159 A | 10/1989 | Cary et al. | 707/203 |
| 4,956,809 A | 9/1990 | George et al. | 707/101 |
| 5,001,628 A | 3/1991 | Johnson et al. | 707/10 |
| 5,065,360 A | 11/1991 | Kelly | 708/142 |
| 5,124,909 A | 6/1992 | Blakely et al. | 709/203 |

(List continued on next page.)

OTHER PUBLICATIONS

Nikookar et al., Waveshaping of Multicarrier Signal for Data Transmission over Wireless Channels, IEEE, pp. 173–177, 1997.*
"Connectivity Pack for the HP 95LX" User's Guide, Hewlett Packard Co., (1991), pp. 1–1 to 6–5.
Droms, R., "Dynamic Host Configuration Protocol", Request for Comments #1541, Oct. 1993, 24 pages.
"Redline, Strikeout, and Document Comparison", pp. 429–435.
"LapLink for Windows SpeedSync", printed from Traveling Software, Inc. website.

(List continued on next page.)

*Primary Examiner*—Albert Decady
*Assistant Examiner*—Shelly A Chase
(74) *Attorney, Agent, or Firm*—Hickman Palermo Truong & Becker LLP; Van Mahamedi

(57) ABSTRACT

A method for minimizing errors in a modulated signal transmitted over a transmission medium. The method is applied to the entire data block, thereby incorporating information about the parities of each row of data to fix and correct the errors in the row. Thereafter ISI removal is applied on a row by row basis, with such corrections being applied via soft decision coding. In particular, the data samples are first collected in a data block (or FEC block). A soft decision buffer is thereafter created by taking each sample involved. An FEC word is created by processing down each row of the soft decision buffer and creating a binary stream out of the sign bits for each table entry. This creates an estimate of the word by thresholding it around the zero level. A syndrome is generated via a comparison of the parity bits for each FEC word. The syndrome provides the most likely bit error positions, represented by an offset into the FEC word. The error positions map back into the array of soft decision buffer entries and the absolute value entries are summed for each corresponding position. This produces sets of numbers and the set with the smallest value is used to indicate the error pattern. The bits believed to be in error are flipped in the FEC word. ISI removal is applied to the soft decision buffer on a row-by-row basis (excluding the first row) to create an intermediate data frame, referred to as the Rx Frame. Upon completion, the process is repeated in the other direction for all of the rows except the last row, on a row-by-row basis. Upon completion, the data block errors will be minimized and the received block should match the transmitted block. The process therefore provides minimal data block errors, but at the same time uses less processing resources.

15 Claims, 17 Drawing Sheets

U.S. PATENT DOCUMENTS

| | | |
|---|---|---|
| 5,142,619 A | 8/1992 | Webster, III ................ 345/343 |
| 5,159,592 A | 10/1992 | Perkins ....................... 370/338 |
| 5,187,787 A | 2/1993 | Skeen et al. ................. 709/314 |
| 5,210,868 A | 5/1993 | Shimada et al. ............ 707/104 |
| 5,237,678 A | 8/1993 | Kuechler et al. ........... 707/104 |
| 5,251,291 A | 10/1993 | Malcolm .................... 707/539 |
| 5,261,045 A | 11/1993 | Scully et al. ............... 345/329 |
| 5,261,094 A | 11/1993 | Everson et al. ............. 707/201 |
| 5,272,628 A | 12/1993 | Koss ........................... 707/503 |
| 5,283,887 A | 2/1994 | Zachery ...................... 707/513 |
| 5,301,313 A | 4/1994 | Terada et al. .................. 707/4 |
| 5,315,709 A | 5/1994 | Alston, Jr. et al. .............. 707/6 |
| 5,327,555 A | 7/1994 | Anderson ................... 707/201 |
| 5,333,252 A | 7/1994 | Brewer, III et al. ........ 707/506 |
| 5,339,434 A | 8/1994 | Rusis .......................... 709/246 |
| 5,355,476 A | 10/1994 | Fukumura ...................... 707/1 |
| 5,379,057 A | 1/1995 | Clough et al. .............. 345/173 |
| 5,392,390 A | 2/1995 | Crozier ....................... 345/335 |
| 5,434,994 A | 7/1995 | Shaheen et al. ............ 709/223 |
| 5,463,772 A | 10/1995 | Thompson et al. ......... 707/101 |
| 5,475,833 A | 12/1995 | Dauerer et al. ............. 707/201 |
| 5,519,606 A | 5/1996 | Frid-Nielsen et al. .......... 705/9 |
| 5,537,592 A | 7/1996 | King et al. ................. 707/200 |
| 5,544,356 A | 8/1996 | Robinson et al. ........... 707/205 |
| 5,546,539 A | 8/1996 | Poling ........................ 707/201 |
| 5,572,528 A | 11/1996 | Shuen ......................... 370/402 |
| 5,574,859 A | 11/1996 | Yeh ............................. 710/101 |
| 5,592,669 A | 1/1997 | Robinson et al. ........... 707/209 |
| 5,598,536 A | 1/1997 | Slaughter, III et al. ..... 709/219 |
| 5,647,002 A | 7/1997 | Brunson ..................... 709/206 |
| 5,649,195 A | 7/1997 | Scott et al. ................. 707/201 |
| 5,666,362 A | 9/1997 | Chen et al. ................. 370/420 |
| 5,666,530 A | 9/1997 | Clark et al. ................. 707/201 |
| 5,684,990 A | 11/1997 | Boothby ..................... 707/203 |
| 5,696,702 A | 12/1997 | Skinner et al. ............. 702/186 |
| 5,706,509 A | 1/1998 | Man-Hak Tso ............. 707/201 |
| 5,710,922 A | 1/1998 | Alley et al. ................. 707/201 |
| 5,724,510 A | 3/1998 | Arndt et al. ................. 709/220 |
| 5,727,159 A | 3/1998 | Kikinis ....................... 709/246 |
| 5,727,202 A | 3/1998 | Kucala ......................... 707/10 |
| 5,729,452 A | 3/1998 | Smith et al. .................. 701/29 |
| 5,742,820 A | 4/1998 | Perlman et al. ............. 707/201 |
| 5,745,699 A | 4/1998 | Lynn et al. ................. 709/245 |
| 5,758,354 A | 5/1998 | Huang et al. ............... 707/201 |
| 5,761,439 A | 6/1998 | Kar et al. .................... 709/248 |
| 5,812,819 A | 9/1998 | Rodwin et al. ............... 703/23 |
| 5,835,530 A * | 11/1998 | Hawkes ....................... 375/225 |

OTHER PUBLICATIONS

"Introducing Windows 95" Microsoft Windows 95—For the Microsoft Windows Operating System, Microsoft Corporation, (1995), p. 66.

"IntelliLink" The Intelligent Link, Microsoft Windows 3 Personal Information Managers, IntelliLink, Inc., (1990).

Cobb, D. et al., "Paradox 3.5 Handbook" Third Edition, Borland Bantam, New York, Oct. 1991, pp. 803–816.

Alfieri, V., "The Best Book of: WordPerfect Version 5.0", Hayden Books, Indianapolis, IN (1988), pp. 151–165.

"PC–Link Release 2 for the Casio B.O.S.S. Business Organizer Scheduling System", Travelling Software, Inc., (1989), pp. 1–60.

"I/O Applications Note" Serial Communications Using the HP 95LX, Hewlett Packard, pp. 1–12.

"Open Network Computing Technical Overview", Sun Microsystems, Inc., pp. 1–32.

"Sharp Organizer Link II, Model OZ–890" Operation Manual, pp. 1–105.

Dialog search results for references generally related to Palmtops, 15 pages.

* cited by examiner

| | | | | | | | | | | | |
|---|---|---|---|---|---|---|---|---|---|---|---|
| 2023 | 5075 | 7713 | 7332 | 4925 | 4323 | 16509 | 13815 | 7395 | 5457 | 13590 | 13900 |
| 1831 | 554 | 3711 | 152 | 9491 | 10599 | 16573 | 7921 | 9908 | 2471 | 1845 | 21385 |
| 1988 | 908 | 12511 | 152 | 3621 | 3214 | 15793 | 2400 | 11498 | 2885 | 815 | 16310 |
| 366 | 8419 | 13023 | 9009 | 504 | 2416 | 12108 | 1205 | 9615 | 6418 | 1394 | 16495 |
| 2630 | 13360 | 8160 | 11298 | 6394 | 396 | 5651 | 5807 | 7629 | 7948 | 306 | 15059 |
| 1691 | 12043 | 9830 | 6018 | 6919 | 1252 | 1851 | 9530 | 1963 | 10622 | 4471 | 11417 |
| 13645 | 9583 | 16934 | 7632 | 10366 | 383 | 8585 | 5619 | 715 | 326 | 9633 | 10222 |
| 15671 | 13146 | 15334 | 4277 | 14585 | 4862 | 8767 | 1688 | 12829 | 5467 | 10965 | 10473 |
| 8960 | 11486 | 17005 | 17980 | 15903 | 8194 | 6010 | 10551 | 13203 | 16433 | 10622 | 165 |
| 3673 | 7029 | 11390 | 19208 | 12754 | 7745 | 7187 | 4248 | 2555 | 11925 | 954 | 8620 |
| 3617 | 4486 | 4252 | 8091 | 8300 | 8668 | 9859 | 7703 | 3889 | 2412 | 3500 | 6370 |
| 1639 | 4590 | 7889 | 1802 | 14541 | 14258 | 10806 | 8526 | 4994 | 8624 | 8971 | 6702 |
| 7273 | 2419 | 8970 | 7274 | 15055 | 14407 | 7425 | 280 | 7711 | 11487 | 6386 | 8664 |
| 3968 | 4208 | 4567 | 13587 | 17951 | 15063 | 7667 | 916 | 5735 | 10196 | 6248 | 4747 |
| 8370 | 7712 | 4688 | 17119 | 23774 | 12212 | 1600 | 12407 | 5376 | 5768 | 16412 | 7420 |
| 12480 | 12178 | 236 | 14892 | 20164 | 8004 | 3361 | 12382 | 6032 | 4542 | 13557 | 10304 |
| 13480 | 1792 | 9718 | 11075 | 15084 | 13342 | 7917 | 4477 | 315 | 2257 | 2421 | 10976 |
| 6249 | 1878 | 16076 | 9872 | 12283 | 13443 | 11853 | 5345 | 9228 | 5898 | 1499 | 8396 |
| 757 | 4693 | 12283 | 15350 | 9106 | 15475 | 16334 | 964 | 3286 | 2920 | 4566 | 9952 |
| 7403 | 4609 | 7896 | 11208 | 4976 | 11771 | 17385 | 8278 | 924 | 3097 | 11732 | 6606 |

| | | | | | | | | | | | |
|---|---|---|---|---|---|---|---|---|---|---|---|
| 2023 | 11743 | 1331 | 3526 | 2550 | 14068 | 5452 | 3159 | 16116 | 10645 | 1520 | 7171 |
| 5075 | 636 | 581 | 10208 | 2161 | 6359 | 6321 | 6790 | 13228 | 10344 | 4092 | 13640 |
| 7713 | 10 | 10273 | 7995 | 11468 | 7845 | 6087 | 7136 | 5832 | 1599 | 4256 | 14499 |
| 7332 | 19550 | 630 | 4183 | 8387 | 8716 | 6257 | 4867 | 2751 | 13057 | 9141 | 2799 |
| 4925 | 153 | 7780 | 8754 | 13836 | 11368 | 10135 | 9108 | 3900 | 18329 | 4414 | 1451 |
| 4323 | 2743 | 8253 | 3087 | 11312 | 14598 | 10503 | 4254 | 8361 | 9839 | 3713 | 1085 |
| 16509 | 10676 | 3229 | 3686 | 13499 | 8787 | 8024 | 7136 | 8083 | 5196 | 14241 | 6401 |
| 13815 | 1987 | 14660 | 7695 | 2443 | 2000 | 9538 | 5439 | 6582 | 10547 | 11707 | 8117 |
| 7395 | 1786 | 795 | 3798 | 12750 | 5508 | 5724 | 13220 | 10205 | 4197 | 10448 | 9238 |
| 5457 | 5049 | 11525 | 8787 | 6697 | 5194 | 4247 | 12572 | 5878 | 6377 | 11608 | 6444 |
| 13590 | 13958 | 6326 | 6306 | 6932 | 9555 | 5335 | 9260 | 2853 | 11722 | 10018 | 6062 |
| 13900 | 4235 | 9463 | 13252 | 3523 | 17373 | 4535 | 2115 | 15284 | 8469 | 7180 | 9373 |
| 4 | 9663 | 8229 | 15480 | 14664 | 10919 | 196 | 5876 | 21939 | 11645 | 11063 | 6811 |
| 1281 | 1050 | 2231 | 11418 | 7302 | 5910 | 2755 | 9652 | 10377 | 43 | 7733 | 9936 |
| 5546 | 1020 | 3816 | 15099 | 9131 | 5352 | 6054 | 4551 | 235 | 11553 | 336 | 15551 |
| 1683 | 14475 | 3972 | 9467 | 8638 | 6083 | 33 | 6829 | 14242 | 9240 | 10231 | 10113 |
| 7656 | 1469 | 9464 | 8531 | 7125 | 4390 | 12706 | 2133 | 7211 | 13249 | 1078 | 911 |
| 8764 | 10254 | 6113 | 2218 | 9651 | 10090 | 12423 | 6043 | 7603 | 11507 | 6528 | 4932 |
| 14738 | 11188 | 2141 | 10420 | 15170 | 2789 | 8971 | 6402 | 14577 | 6082 | 10449 | 9897 |
| 9756 | 10844 | 13224 | 7454 | 19815 | 10455 | 6691 | 11752 | 9255 | 6312 | 13515 | 4772 |

```
0 0 0 1 0 0 1 1 0 1 0 0
1 1 1 0 0 0 1 0 1 1 1 0
0 0 1 1 1 1 1 1 1 1 0 0
1 1 1 0 0 0 1 0 1 1 1 0
0 1 1 0 0 1 1 1 1 1 0 0
1 1 1 0 1 0 0 1 0 1 1 1
0 0 1 1 1 1 1 0 1 0 0 1
0 0 1 1 1 0 1 1 0 1 0 1
0 0 1 0 1 0 0 1 0 1 0 0
1 0 1 0 1 0 0 0 1 1 1 1
0 1 0 0 0 1 0 1 0 0 0 1
0 1 0 0 0 1 0 1 0 0 0 1
1 0 0 0 0 1 1 0 0 0 0 1
1 1 1 0 0 1 1 1 0 0 1 0
0 1 1 0 0 1 0 0 1 1 1 1
0 1 0 0 0 0 1 0 1 0 1 1
0 1 1 0 0 0 1 1 0 1 0 1
0 0 1 1 0 0 1 0 1 0 1 0
1 1 1 1 0 0 1 1 1 1 0 0
0 0 1 1 1 0 1 0 0 0 0 0
```

—1600

| | | | | | | | | | | | |
|---|---|---|---|---|---|---|---|---|---|---|---|
| 3858 | 9908 | 3166 | 5361 | 4384 | 12233 | 3617 | 1325 | 14281 | 8810 | 3355 | 9106 |
| 6910 | 1199 | 1254 | 12043 | 3996 | 4524 | 4486 | 4955 | 11393 | 8509 | 5927 | 11805 |
| 9548 | 1825 | 8438 | 6160 | 9633 | 6010 | 4252 | 5301 | 7667 | 3434 | 6090 | 12664 |
| 9167 | 17715 | 2464 | 6018 | 6552 | 10551 | 4422 | 3032 | 4586 | 11222 | 10976 | 4634 |
| 3090 | 1682 | 5945 | 6919 | 12001 | 13203 | 8300 | 7273 | 5735 | 16494 | 6249 | 3286 |
| 2489 | 4578 | 6418 | 4922 | 9477 | 12763 | 8668 | 6089 | 10196 | 8004 | 5548 | 750 |
| 14674 | 8841 | 5064 | 5521 | 11664 | 10622 | 6189 | 8970 | 6248 | 3361 | 12406 | 4566 |
| 15650 | 3822 | 12825 | 9530 | 4277 | 3835 | 7703 | 3604 | 8417 | 12382 | 9872 | 6282 |
| 9230 | 49 | 2630 | 5633 | 10915 | 7343 | 3889 | 11385 | 8370 | 6032 | 8613 | 9238 |
| 3622 | 6884 | 9690 | 10622 | 4862 | 7029 | 2412 | 10737 | 4043 | 8212 | 9773 | 6444 |
| 15425 | 12123 | 4491 | 8141 | 8767 | 11390 | 3500 | 7425 | 4688 | 13557 | 8183 | 6062 |
| 12065 | 6070 | 7628 | 11417 | 1688 | 15538 | 2700 | 3950 | 13449 | 6634 | 9015 | 9373 |
| 1839 | 7828 | 10064 | 13645 | 12829 | 12754 | 1639 | 4041 | 20104 | 9810 | 9228 | 6811 |
| 3116 | 784 | 396 | 9583 | 5467 | 7745 | 4590 | 7817 | 12212 | 1792 | 9568 | 9936 |
| 3711 | 2855 | 5651 | 13265 | 7296 | 3517 | 4219 | 6386 | 2070 | 9718 | 2171 | 15551 |
| 3518 | 12640 | 2137 | 7632 | 10473 | 7918 | 1868 | 8664 | 12407 | 11075 | 8396 | 10113 |
| 9491 | 366 | 11299 | 6696 | 8960 | 6225 | 10871 | 3968 | 5376 | 11414 | 2912 | 911 |
| 10599 | 8419 | 4278 | 4053 | 7816 | 11925 | 10588 | 4208 | 9438 | 9672 | 8363 | 4932 |
| 12903 | 9353 | 3976 | 8585 | 13335 | 4624 | 10806 | 4567 | 12742 | 4247 | 8614 | 9897 |
| 11591 | 9009 | 15059 | 9289 | 17980 | 8620 | 8526 | 9917 | 7420 | 8147 | 11680 | 4772 |

FIG. 17

METHOD OF EXTRACTING BITS FROM MODULATED WAVEFORMS

BACKGROUND OF THE INVENTION

1. Field of the Invention

The present invention relates to a method for extracting bits with minimal errors from a modulated waveform by using information from the entire transmitted data block to remove intersymbol interference from the decoded data.

2. Description of Related Art

Digital signal processing (DSP) refers to the various techniques for improving the accuracy and reliability of digital communications. The developed theories and mathematical solutions behind DSP are quite complex and beyond the scope of this description. However, the basic premise behind DSP involves clarifying, or standardizing, the levels or states of a digital signal. A DSP circuit is able to differentiate between human-made signals, which are orderly, and noise, which is inherently random or chaotic.

All communications circuits contain some noise. Such is the case whether the signals are analog or digital, and regardless of the type of information conveyed. Practitioners in the field are continually striving to find new ways to improve the signal-to-noise (S/N) ratio in communications systems. Traditional methods of optimizing the S/N ratio include increasing the transmitted signal power and increasing the receiver sensitivity. In wireless systems, specialized antenna configurations are also used. Digital signal processing dramatically improves the sensitivity of a receiving unit. The effect is most noticeable when noise competes with a desired signal. A good DSP circuit can greatly improve the S/N ratio, but there are limits as to what the circuit can do. If the noise is so strong that all traces of the signal are obliterated, then a DSP cannot find any order in the chaos, and no signal will be received.

If the incoming signal is analog, for example from a standard television broadcast station, the signal is first converted to digital form by an analog-to-digital converter (ADC). The resulting digital signal has two or more levels. Ideally, these levels are always predictable voltages or currents. However, because the incoming signal contains noise, the levels are not always at the standard values. In general terms, the DSP adjusts the levels so that they are at the correct values. This essentially eliminates the noise components in the signal. The DSP acts directly on the incoming signal, thereby eliminating irregularities caused by noise, and thereby minimizing the number of errors per unit time.

The proliferation of portable computers and computing devices in today's society has increased the demand for transmission of data over wireless links. Binary data, composed (for instance) of sharp "one to zero" and "zero to one" transitions, results in a spectrum rich in harmonic content that is not well suited to radio frequency (RF) transmission. Hence, the field of digital modulation has been providing various transmission solutions. Recent standards such as Cellular Digital Packet Data (CDPD) and Mobitex (Mobitex is a trademark owned by Telia Corporation) specify Gaussian filtered Minimum Shift Keying (GMSK) for their modulation method. Other modulation techniques include frequency shift keying (FSK), multi-level frequency shift keying (MFSK), continuous phase frequency shift keying (CPFSK), minimum shift keying (MSK), tamed frequency modulation (TFM), phase shift keying (PSK), quadrature phase shift keying (QPSK), differential quadrature phase shift keying (DQPSK), Pi/4 DQPSK, quadrature amplitude modulation (QAM).

Referring now to FIG. 1a, a radio station 110 is shown transmitting a signal 112 to a receiving device 114. The modulation technique shown includes GMSK 116 with a BT of 0.3. Typical data rates of the link include 8000 bps (bits per second), which translates to a bandwidth of approximately 2400 Hz. The frequency affects the amount of intersymbol interference (ISI) associated with the signal. FIG. 1b shows a block diagram of the data sequence 120 which generally comprises such a transmission. The first 16 bits are bit sync information 122. The second 16 bits are frame sync information 124. The next 24 bits are the frame head. The last sequence of bits comprise the data blocks 126, which might number from 1 to 32. FIG. 1c shows a representative data block 130 which includes 12 columns (132) by 20 rows (134) of data bits. Each row includes 8 data bits 136 and 4 parity bits 138, which further represents a (12,8) Hamming code. 18 bytes are generated and then the final two bytes 140 and 142 are CRC's (or cyclic redundancy checking).

FIG. 2 shows a block diagram 200 for generating and providing error correction on a data block transmitted via a modulation technique. An analog input 202 is fed into an ADC 204 to produce an 8 bit data value. An equalizer 206 typically applies 16 bit DSP operations on the incoming data value to remove ISI. DSP equalizer systems have become ubiquitous in many diverse applications including voice, data, and video communications via various transmission media. Typical applications range from acoustic echo cancelers for full-duplex speaker phones to video deghosting systems for terrestrial television broadcasts to signal conditioners for wireline modems and wireless telephony. Equalizer schemes include, for example, decision feedback equalizers (DFE), zero forcing equalizers, and minimum mean square error equalizers (MMSE). The effect of an equalization system is to compensate for transmission-channel impairments such as frequency-dependant phase and amplitude distortion. If the channel impulse response can be defined, a filter (such as FIR, or IIR) can be implemented to counter the ill effects of the channel. The 16 bits of DSP data are then fed into a detector 208 which produces a 1 bit result used to build the data block. Thereafter Forward Error Correction (FEC) is applied, and the CRC's are used to verify whether the data was received correctly.

FIG. 3 shows an example plot 300 of waveforms for pulsed information which have been transmitted over an analog channel such as a phone line or airwaves. Even though the original signal is a discrete time sequence, the received signal is a continuous time signal. Heuristically, the channel might be considered to act as an analog low-pass filter, thereby spreading or smearing the shape of the impulse train into a continuous signal whose peaks relate to the amplitudes of the original pulses. Mathematically, the operation can be described as a convolution of the pulse sequence by a continuous time channel response. The resulting signal is a function of time (t) and the symbol period (T). The signal consists of the sum of many scaled and shifted continuous time system impulse responses. The impulse responses are scaled by the amplitudes of the transmitted pulses.

In FIG. 3, a data transmission of example bits 1, 0, 1 might be represented by the summation of the three waveforms 302, 304, and 306. Each of the waveform elements (e.g. 302) could be represented, in its simplest form, as a +n or −n level spanning only a single symbol period T. However, this manner of transmission uses significant bandwidth. To get more information, but use less bandwidth, the signal element will instead be made to spread out and span (for example) 3 symbol periods. At each sample period, the various waveforms are summed to produce the resulting waveform. When ISI is present, the symbols interfere with each other and create difficulties in reconstructing the summed wave. ISI is particularly difficult to remove for sample periods (e.g. 308) where 2 or more waveforms are providing contributions to the summed result.

Prior solutions have used the equalizer element to attempt to remove ISI effects from the modulated data. The ultimate design and functionality of the equalizer depends, among other things, upon proper modeling of the channel impulse response. The equalizer then derives subtraction components at each of the sampling points to produce the proper waveform result. Equalizer design has proven to be difficult, often inaccurate, and certain implementations are processor resource intensive.

Hence, what is needed in the field is a method or solution which provides a significant improvement in error correction rates, and yet saves processor resources. The solution should use information relating to the entire data block, rather than equalizer/filter solutions tied to the channel response, in order to minimize data block errors.

SUMMARY OF THE INVENTION

The present invention provides a method for minimizing errors in a modulated signal transmitted over a transmission medium. The method is applied to the entire data block, thereby incorporating information about the parities of each row of data and the data block CRC's to fix and correct the errors in the block. Thereafter ISI removal is applied on a row by row basis, with such corrections being applied via soft decision coding. In particular, the data samples are first collected in a data block (or FEC block). A soft decision buffer holds the samples. An FEC word is created by processing down each row of the soft decision buffer and creating a binary stream out of the sign bits for each table entry. This creates an estimate of the word by thresholding it around the zero level. A syndrome is generated via a comparison of the parity bits for each FEC word. The syndrome provides the most likely bit position errors, represented by offsets into the FEC word. The position errors map back into the array of soft decision buffer entries and the absolute value of the entries are summed for each corresponding position. This produces sets of numbers and the set with the smallest value is used to determine the error pattern. The bits believed to be in error are flipped in the FEC word. ISI removal is applied to the soft decision buffer on a row-by-row basis (excluding the first row) after FEC decoding to create an intermediate data frame, referred to as the Rx Frame. Upon completion, the process is repeated in the other direction for all of the rows on a row-by-row basis, except the last row. Upon completion, the data block errors will be minimized and the received block should match the transmitted block. The process therefore provides minimal data block errors, but at the same time uses less processing resources.

Accordingly, an aspect of the present invention is to provide a method of extracting bits from modulated waveforms, the method comprising the steps of: receiving analog data; converting the analog data to digital data; generating a sample table having entries arranged in rows, wherein each entry has multiple bits corresponding to the amplitude of the sampled bit at a symbol time; for each row except the first row, proceeding from the top to the bottom of the sample table, creating an estimate by thresholding around the zero level; generating a most likely bit error pattern from the samples and flipping the erroneous bits; performing intersymbol interference (ISI) level adjustment as derived from the previously processed row; and repeating for each row in the reverse direction except the last row, as going from the bottom to the top of the sample table.

Yet another aspect of the present invention is to provide the method described above wherein an intermediate data frame is used to perform ISI level adjustment as derived from the previously processed row.

Still another aspect of the present invention is provide the method described above wherein after converting the analog data to digital data, the additional step of removing direct current (DC) components is applied.

Another aspect of the present invention is to provide the method described above wherein the steps of creating an estimate by thresholding around the zero level and generating a most likely bit error pattern are further comprised of: deriving an FEC word from a row of sample entries which includes data bits and parity bits, and generating a one and two bit error syndrome by XORing the parity bits of the FEC word with parity bits derived from a look-up table using the FEC word data bits.

Yet another aspect of the present invention is to provide the method described above wherein the error syndrome further includes 2 bit error positions.

Still another aspect of the present invention is to provide the method described above wherein the steps further include: mapping each error syndrome into the sample table entries and summing the absolute values of the corresponding table entries to form a list of numbers.

Still another aspect of the present invention is to provide the method described above wherein the steps further include: determining the smallest number in the list and using it as the most likely error pattern, wherein the bits are flipped in the FEC word.

Other aspects and advantages of the present invention can be seen upon review of the figures, the detailed description, and the claims which follow.

BRIEF DESCRIPTION OF THE FIGURES

FIG. 11 shows example data from a transmitted FEC data block.

FIG. 12 shows example data in the soft decision buffer corresponding to the data block in FIG. 11.

FIG. 14 shows the corresponding decoded FEC block from FIG. 13, and the errors remaining therein.

FIG. 15 shows the soft decision (or reliability) buffer which has been adjusted after the first pass.

FIG. 17 shows the final values in the corresponding soft decision (or reliability) buffer.

DETAILED DESCRIPTION

A detailed description of the preferred embodiments of the present invention is provided with reference to FIGS. 1–10. FIGS. 1a, 1b, 1c, 2 and 3 illustrate prior art concepts relating to the background of the invention. FIGS. 4–10 illustrate aspects relating to implementation of the present invention. FIGS. 11–17 shows illustrative data sets which have been operated on by the method of the present invention.

Figure 1A:
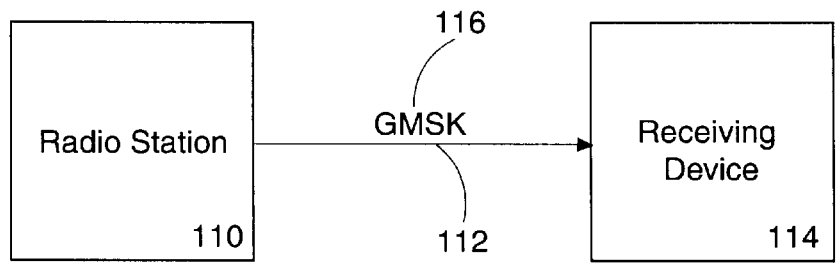
FIG. 1a shows a prior art block diagram of a data transmission via an example GMSK modulation technique.
Figure 1B:
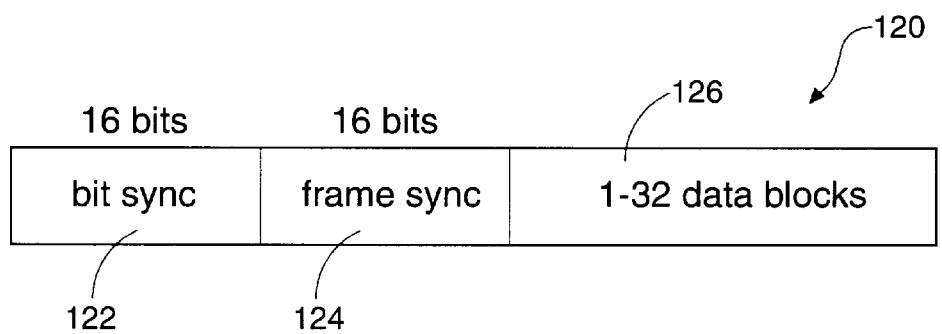
FIG. 1b shows a prior art block diagram of the field comprising a data transmission.
Figure 1C:
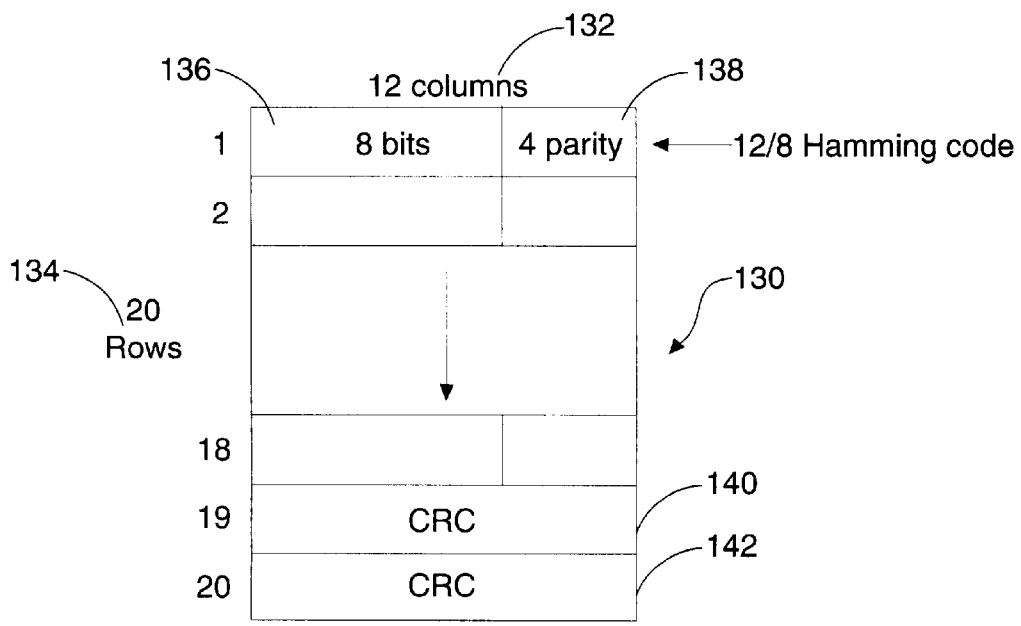
FIG. 1c shows a prior art block diagram of the bit fields comprising a data block.
Figure 2:
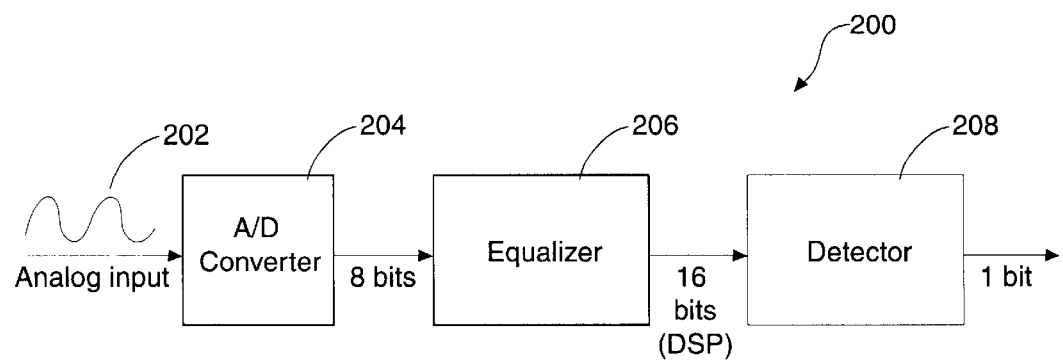
FIG. 2 shows a prior art block diagram of the elements used to processing a data transmission signal.
Figure 3:
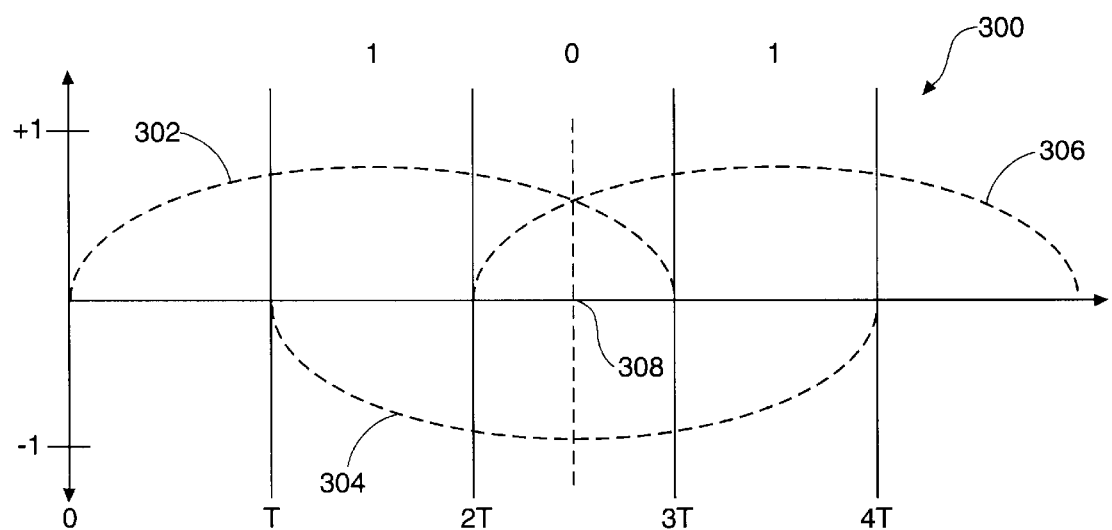
FIG. 3 shows a prior art block diagram of a typical modulated data transmission wherein ISI might result.
Figure 4:
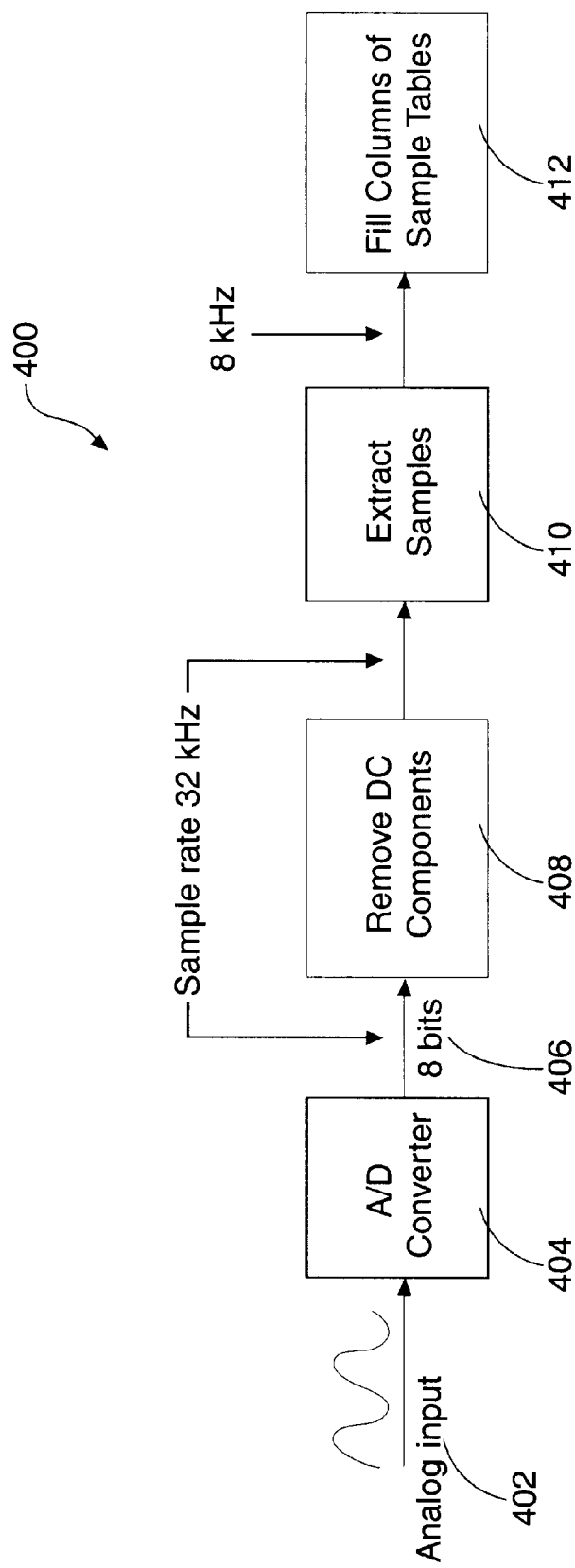
FIG. 4 shows a block diagram of elements used to generate a samples table.

Referring now to FIG. 4, a block diagram 400 is shown of representative elements used to process a signal and generate data samples in a table. An analog input 400 is fed into an analog-to-digital converter (ADC) 404, which produces an 8 bit value 406. Next the DC components of the value are removed in an elemental block 408. The representative sampling rate before block 408 is 32 kHz and after block 408 is 8 kHz. 8 kHz samples are extracted in elemental block 410. The samples are thereafter used in block 412 to fill the columns of a sample table. Note that under the processing method presented herein, the DSP used by the present invention (e.g. Lucent 1615, or Pomp 15) runs at 4 MIPS (million instructions per second), but is capable of 20 MIPS. Therefore, processing resources are conserved and still available for other tasks.

Figure 5:
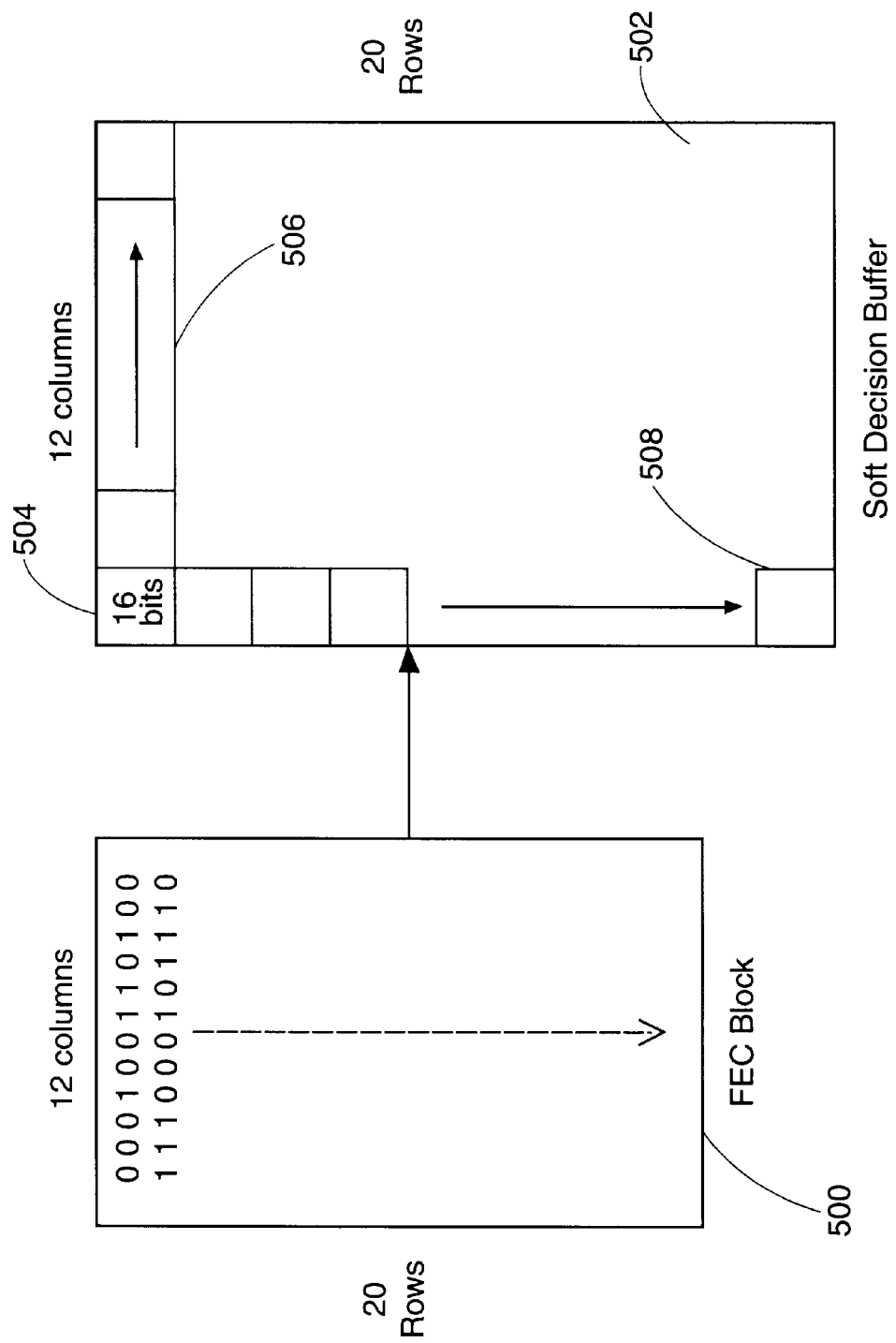
FIG. 5 shows a block diagram of and FEC block and the corresponding soft decision buffer.

Referring now to FIG. 5, an FEC block 500 is shown which contains, for example, 12 columns by 20 rows of data bit information to be transmitted. The block is transmitted and received, and a sample table, also referred to as a soft decision buffer 502 is created therefrom to facilitate removing the data block errors according the present invention. The buffer 502 contains 12 columns by 20 rows of data sample or entries, with each entry containing the audio sample (or the like) corresponding to each transmitted FEC block entry. Each sample (e.g. 504) is comprised of a 16 bit number, which might be analogized to a "grey scale" of the corresponding amplitude value. The twelve 16 bit samples extend across to form each row 506, and the twenty rows (e.g. 508) comprise the soft decision buffer array 502.

Figure 6:
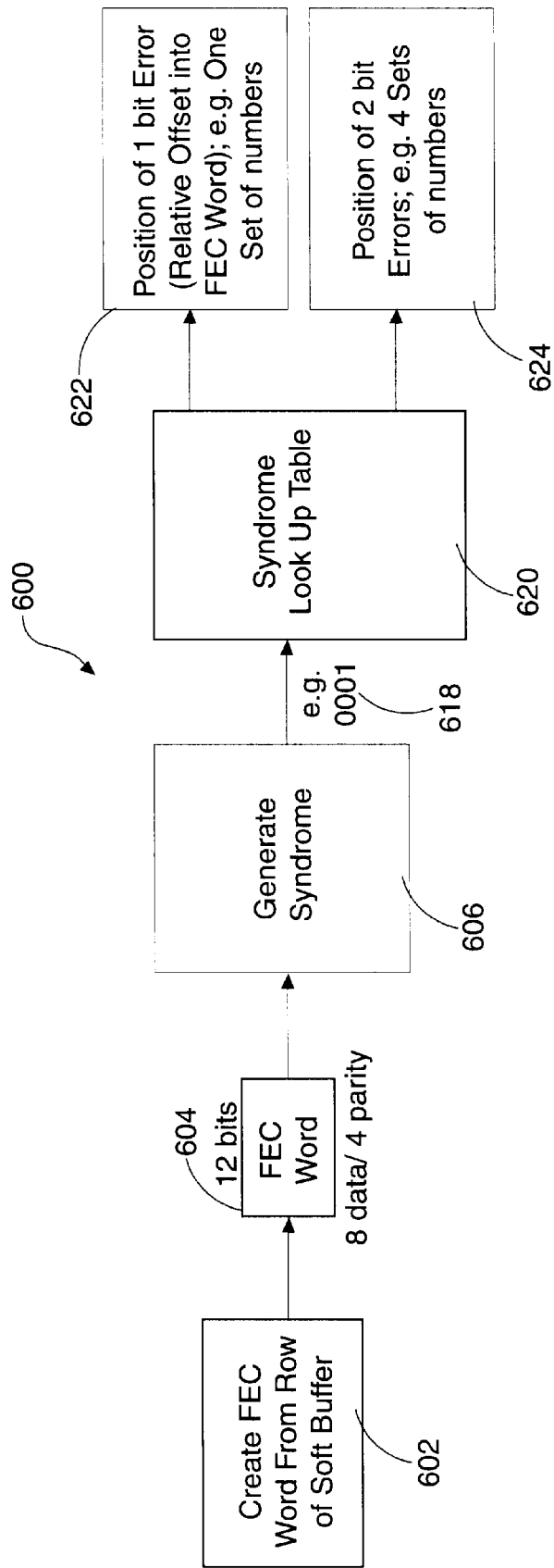
FIG. 6 shows a block diagram of elements used to generate a syndrome, which translates to bit position errors.
Figure 7:
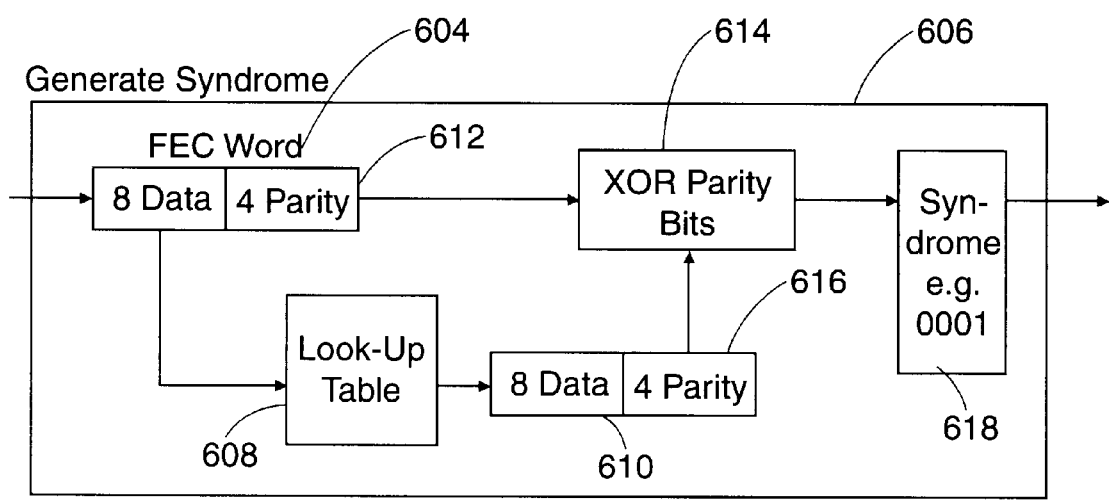
FIG. 7 shows a block diagram of the general steps performed within the generate syndrome element.

Referring now to FIG. 6, a block diagram 600 is shown of the representative elements used to generate a likely representation of the bit error position. In block element 602 an FEC word is created from each row of the soft decision buffer elements by taking the sign bit of each entry and performing a shift operation to generate the FEC word. As shown in block 604, the FEC word (for this example) will consist of 12 bits, with 8 data bits and 4 parity bits. The FEC word 604 is then fed into a block element 606 for generating the syndrome, or in other words generating the likely bit error position in the FEC word. Referring also to FIG. 7, a block diagram is shown of the representative elements used to generate the syndrome 606. The 8 data bits of the incoming FEC word 604 are fed into a look-up table 608 which produces a corresponding word 610 having 8 data bits and 4 parity bits. The 4 parity bits 612 from the FEC word 604 and the 4 parity bits from the resulting look-up table word 610 fed into an XOR (exclusive or) gate 614. The output of this XOR gate produces a syndrome 618 which gives an indication of what the possible error patterns might be in the FEC word. If the XOR result produces zeros, then no detectable/correctable errors have occurred. This 4 bit pattern (shown for example as 0001) might produce 16 different variations. However, since the FEC word is comprised of only 12 bits, then 2 of these syndromes might be used to indicate 2 bit error patterns.

Referring back again to FIG. 6, the syndrome output 618 is fed into a syndrome look-up table 620. The output from the table will consist, for example, of the position of a 1 bit error 622. This position will be indicated by a relative offset into the FEC word, and will result in one set of numbers (see description for FIG. 8 below). The syndrome look-up table 620 might also generate the position of 2 bit errors 624. These positions will be indicated by relative offsets into the FEC word, and will result in multiple sets of numbers. For example, 4 sets of numbers might be generated (again see FIG. 8 below).

Figure 8:
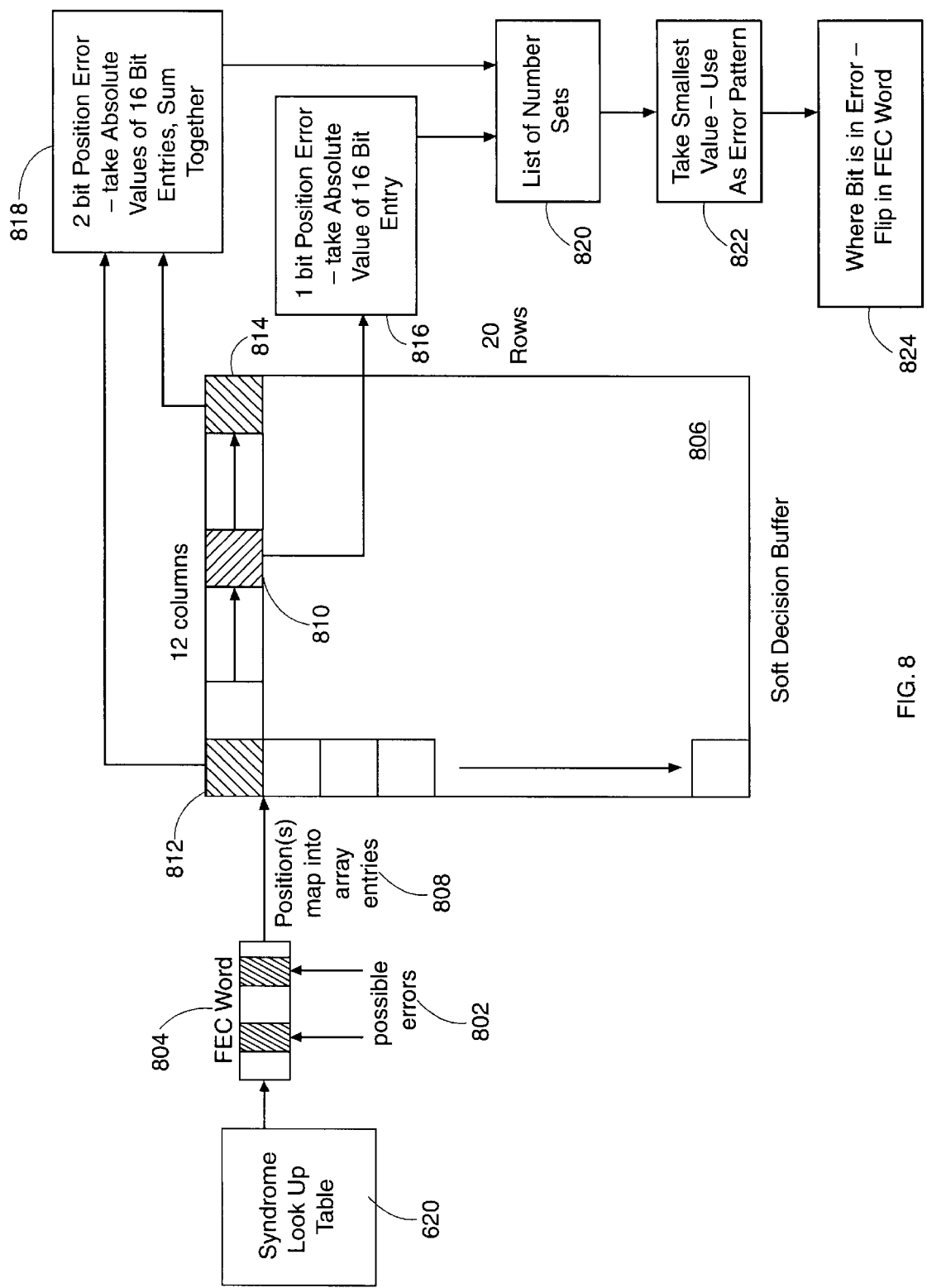
FIG. 8 shows a block diagram of the relation between the FEC word position errors and the soft decision buffer element.

Referring now to FIG. 8, a block diagram 800 is shown which illustrates the relationship between the bit error positions in the FEC word and the soft decision buffer array. The syndrome look-up table 620 (from FIG. 6) provides an indication of possible error positions 802 in the FEC word 804. The error positions map into the array entries in the soft decision buffer 806, as shown by arrow 808. For example purposes, a 1 bit error position might map into a single soft decision buffer element 810. In this instance, the absolute value of this 16 bit entry is computed as shown in block 816. If a two-bit error position is also generated by the syndrome lookup table 620, then these error positions might map into the example soft decision buffer array elements 812 and 814. The absolute value of each of the 16 bit array entries is computed, and the values are summed together. For each set of bit error positions generated by the syndrome look-up table 620, a numbers set (summed or otherwise) is produced. The sets are listed in step 820 and the smallest value among the listed numbers is used as the error pattern as shown in step 822. Finally, where it is decided that a particular bit is in error which corresponds to this arrived upon bit error pattern, that particular bit is flipped in the FEC word, as shown in step 824.

Figure 9:
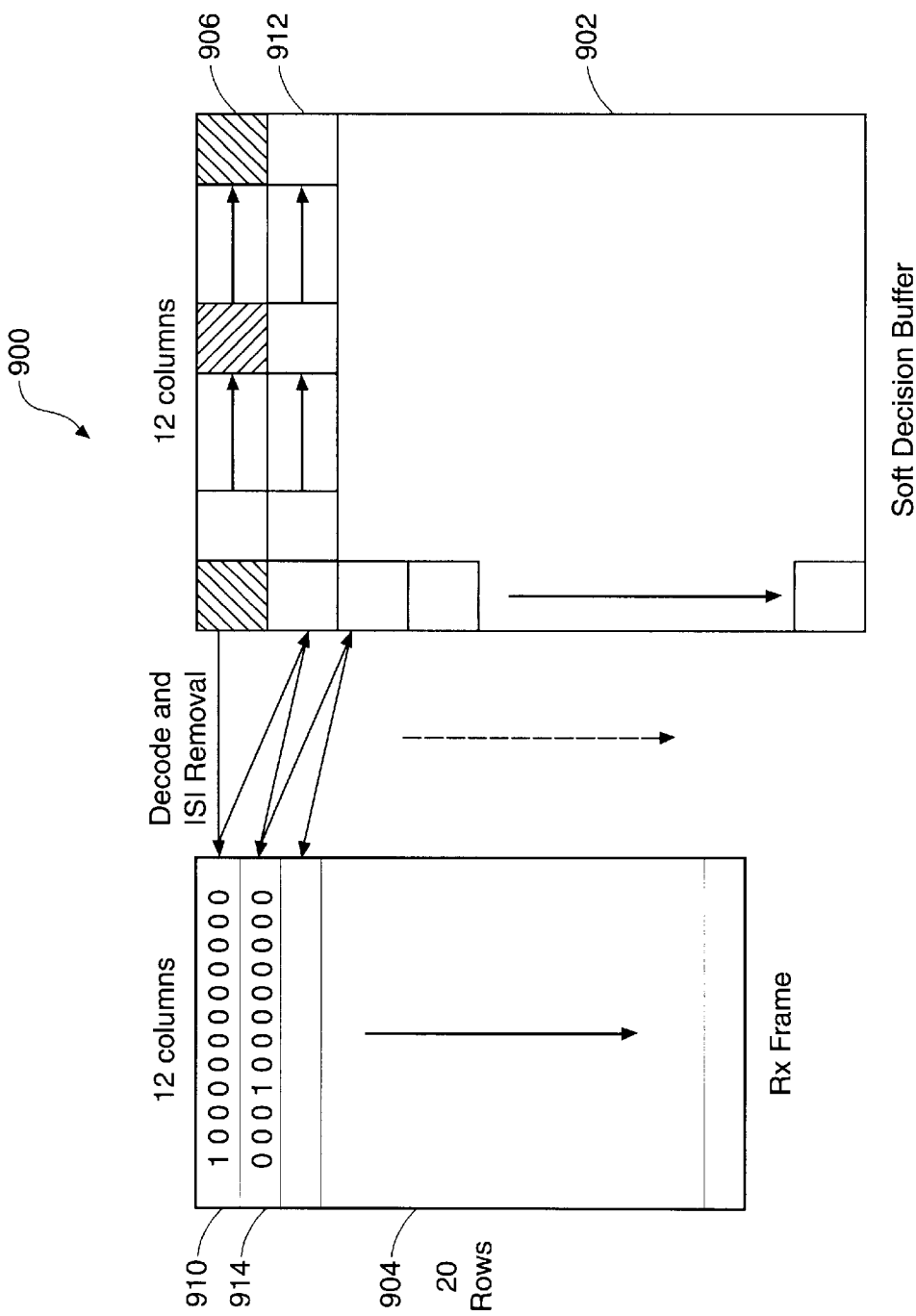
FIG. 9 shows a block diagram of the row-by-row generation of an Rx Frame from the soft decision buffer.

Referring now to FIG. 9, a block diagram 900 is shown which illustrates the step of decoding the soft decision buffer values 902 and performing ISI removal to generate an Rx frame 904. The method is performed on a row-by-row basis wherein the first row 906 of the soft decision buffer 902 is used to generate the first row 910 of the of the Rx frame 904. Note that the first row 906 of the soft decision buffer 902 is a special case because it is not generated from an Rx frame row. Row 910 of the Rx frame is then used to generate the second row 912 of the soft decision buffer 902. Row 912 is then used to generate the second row 914 of the Rx frame 904, and so forth until the Rx frame is completed. As a result, the Rx frame values are used to "fix" the audio samples in the soft buffer, or in other words, to take the deltas out of the representative waveforms (see examples in FIG. 3) via ISI correction techniques. During the ISI correction, the amount to subtract out for each sample would likely be hard coded depending upon the type of processor used. Alternatively, the amount could be a user set, or programmable, variable. See FIG. 11 for an example of the results of the process of FIG. 9.

Figure 10:
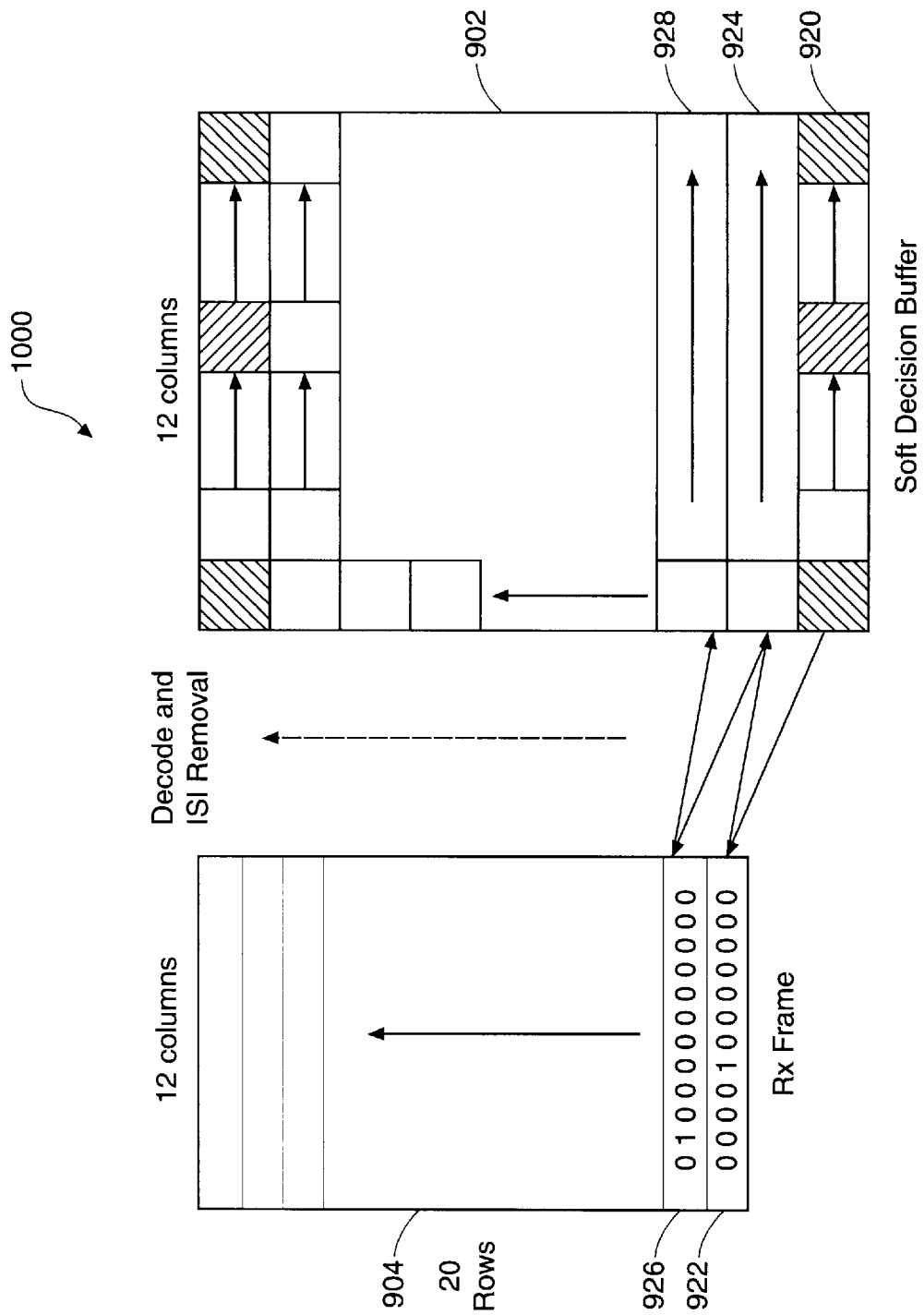
FIG. 10 shows a block diagram of the second pass upwards through the soft decision buffer to generate an Rx Frame.

Referring now to FIG. 10, a block diagram 1000 is shown wherein the method of the present invention next performs a similar operation, or second pass, in reverse order to regenerate the final values in the Rx frame 904. As shown, the last row 920 of the soft decision buffer 902 is used to generate the last row 922 in the Rx frame 904. Row 922 in the is then used to generate row 924 in the soft decision buffer 902. Row 924 is then used to generate row 926 in the Rx frame 904. Row 926 is then used to generate row 928 in the Rx frame, and so forth until the Rx frame is again completed. The corrected data entries in the soft decision buffer should thereby be decodable to match, with a minimal degree of error, the original message originally transmitted.

Referring now to FIG. 11, an example FEC data block 1100 is shown which was transmitted to a receiving station.

FIG. 12 shows the absolute values of the contents of the soft decision buffer 1200 before any error correction (e.g. FEC or ISI) takes place. The soft decision buffer contains the audio samples.

Figure 13:
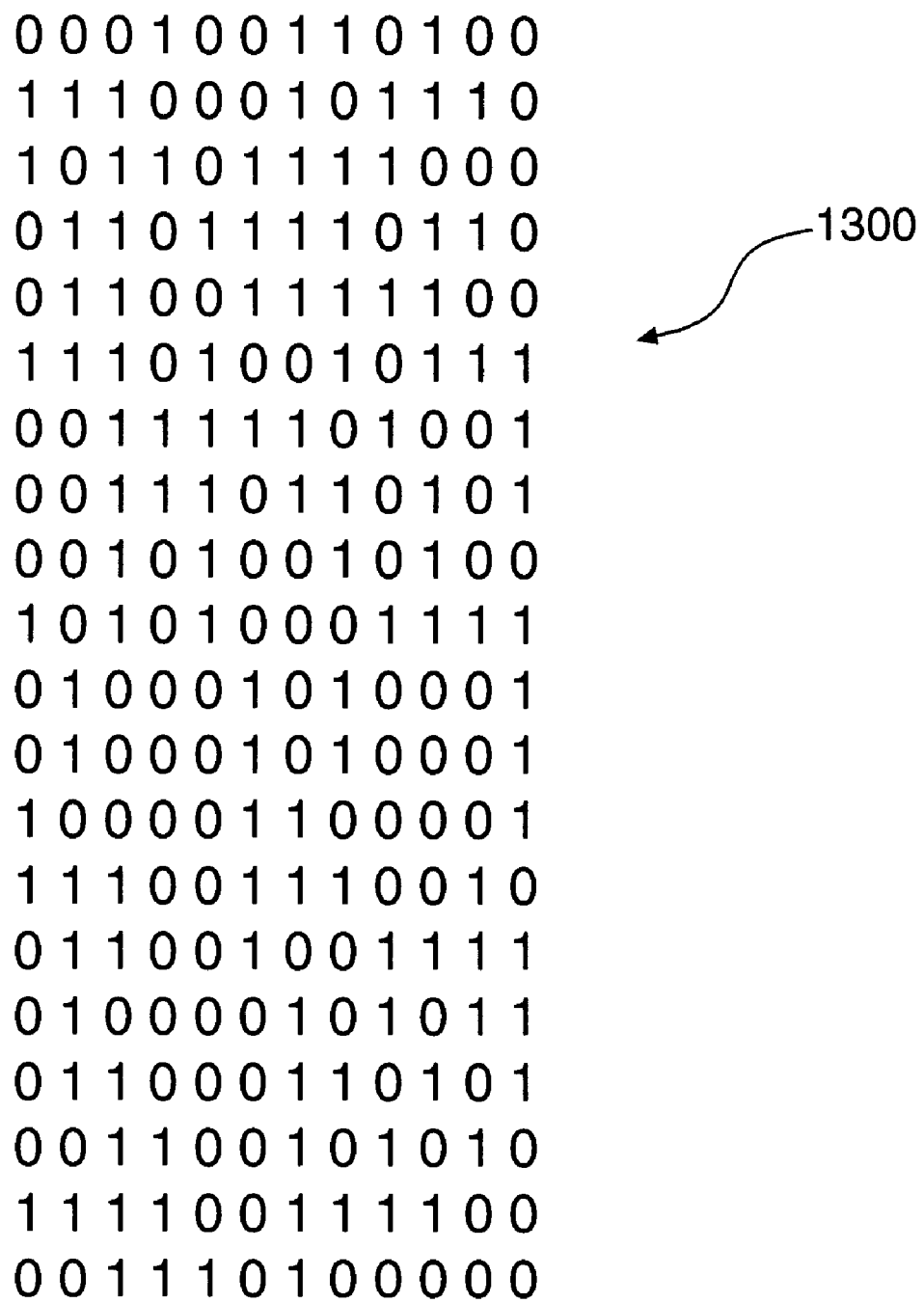
FIG. 13 shows the FEC block generated after the first pass through the data according to the present method.

FIG. 13 shows the resulting FEC block 1300 generated after the first pass through the data.

Figure 14:
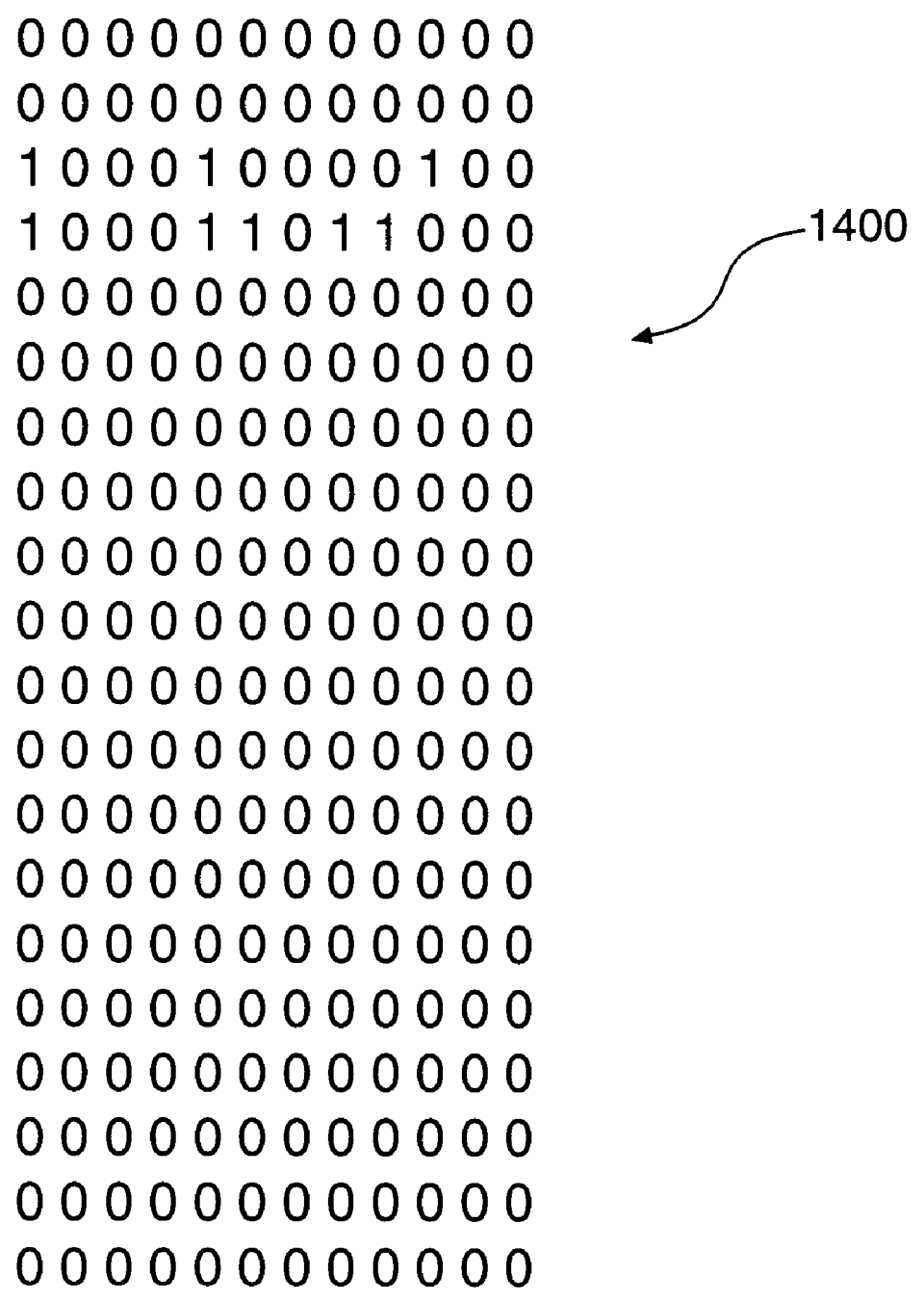

FIG. 14 shows an additional intermediate data block 1400 which shows that there are still errors remaining in the FEC block after the first pass. The error locations are shown by 1's, and there are 8 errors remaining in the decoded FEC block.

FIG. 15 shows the soft decision buffer 1500, which is also referred to as the reliability buffer. The buffer data has been partially ISI adjusted after the data pass.

Figure 16:
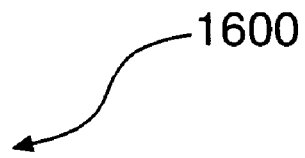
FIG. 16 shows the FEC block after the second pass where t−1 and t+1 ISI removal has taken place.

FIG. 16 shows the FEC block 1600 after the second pass where t−1 and t+1 ISI removal has taken place. This block is the same as the FEC block that was transmitted in FIG. 11. Hence, the errors have been properly removed.

FIG. 17 shows the final values in the reliability buffer 1700 after both data passes have resulted in error free conditions.

Figure 18:
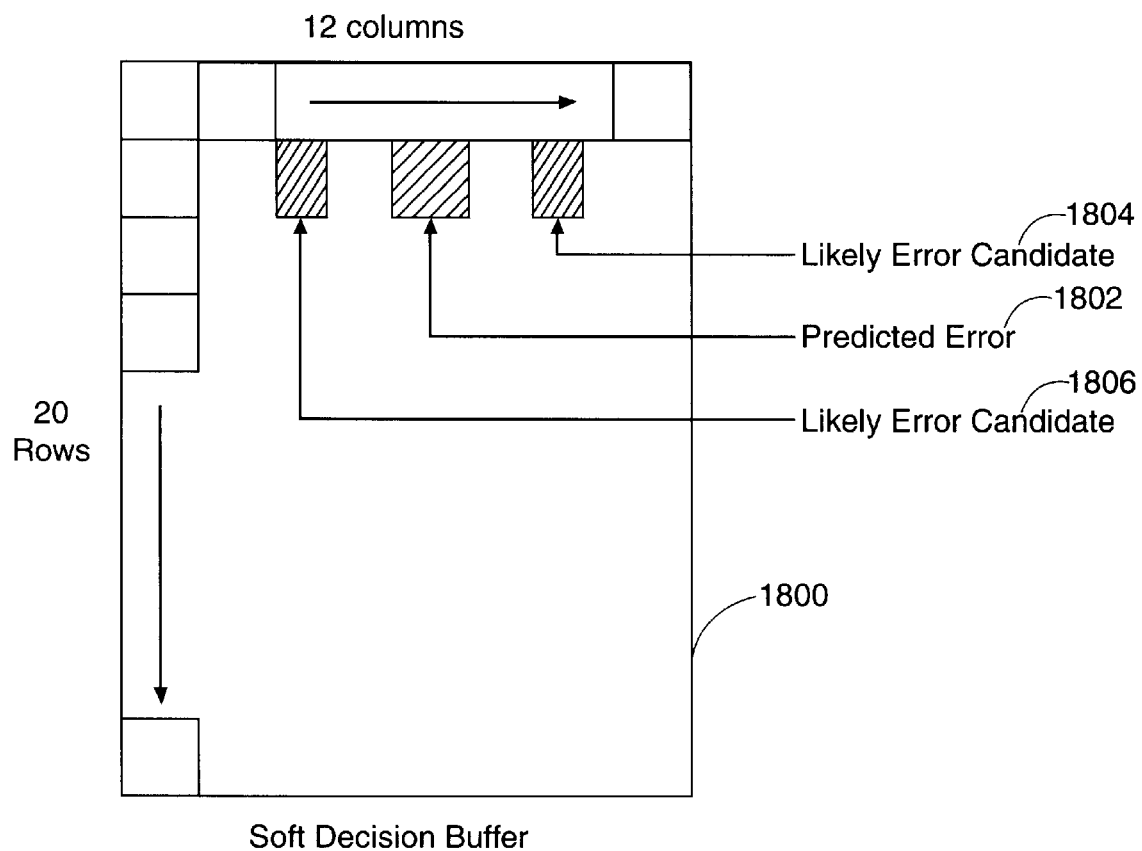
FIG. 18 shows a soft data buffer detailing a method for correcting fading relating neighboring data.

While not discussed in great detail, the above described error correction techniques might similarly be applied to correct errors caused by fading. Under such conditions, neighboring data in the data block, or in surrounding data blocks, might have errors which are more predictable due to their proximate relation to data which has an error. Referring now to FIG. 18, an example soft decision buffer 1800 is shown. Using the techniques demonstrated above, an error 1802 can be predicted. Errors might also occur on either side as 1804 and 1806, such locations being likely error candidates given their proximity to error 1802. The amount of weighting to be afforded to such likely candidates could vary depending upon conditions. In most cases, the weighting would remain a programmable variable, rather than a fixed value.

The foregoing description of a preferred embodiment of the invention has been presented for purposes of illustration and description. It is not intended to be exhaustive or to limit the invention to the precise forms disclosed. It is intended that the scope of the invention be defined by the following claims and their equivalents.

What is claimed is:

1. A method of extracting bits from modulated waveforms, the method comprising the steps of:
   receiving analog data;
   converting the analog data to digital data;
   generating a sample table having entries arranged in rows, wherein each entry has multiple bits corresponding to the amplitude of a sampled bit at a symbol time;
   for each row except the first row,
      creating an estimate by thresholding around the zero level;
      generating a most likely bit error pattern from the samples and flipping the erroneous bits;
      performing intersymbol interference (ISI) level adjustment as derived from the previously processed row; and repeating for each row in the reverse direction, except for the last row.

2. The method of claim 1, wherein an intermediate data frame is used to perform ISI level adjustment as derived from the previously processed row.

3. The method of claim 2, wherein after converting the analog data to digital data, the additional step of removing direct current (DC) components is applied.

4. The method of claim 3, wherein the steps of creating an estimate word by thresholding around the zero level and generating a most likely bit error pattern are further comprised of:
   deriving an FEC word from a row of sample entries which includes data bits and parity bits, and
   generating at least a one bit error syndrome by XORing the parity bits of the FEC word with parity bits derived from a look-up table using the FEC word data bits.

5. The method of claim 4, wherein the error syndrome further includes 2 bit error positions.

6. The method of claim 4, wherein the steps further include:
   mapping each error syndrome into the sample table entries and summing the absolute values of the corresponding table entries to form a list of numbers.

7. The method of claim 6, wherein the steps further include:
   determining the smallest number in the list and using it as the most likely error pattern, wherein the bits are flipped in the FEC word.

8. The method of claim 1, wherein for each row except the first row, the method further comprises proceeding from the top to the bottom of the sample table.

9. The method of claim 1, wherein the step of repeating for each row in the reverse direction except for the last row, includes going from the bottom to the top of the sample table.

10. A method for correcting errors in data blocks representing a modulated waveform, the method comprising the steps of:
   receiving an analog input signal;
   performing an analog to digital conversion on the signal;
   removing DC components from the digital result;
   extracting samples to fill columns of a sample table, the sample table being comprised of rows and columns of sample entries;
   for each row except the first row, proceeding from the top to the bottom of the sample table,
      creating an estimate by thresholding around the zero level;
      generating at least one position of an error in the sample entries;
      flipping the at least one bit represented by the error;
      performing intersymbol interference (ISI) level adjustment as derived from the previously processed row;

repeating for each row in the reverse direction except the last row, as going from the bottom to the top of the sample table.

11. The method of claim 10, wherein an intermediate data frame is used to perform ISI level adjustment as derived from the previously processed row.

12. The method of claim 10, wherein the steps of creating and estimate and thresholding around the zero level and generating at least one position of an error are further comprised of:

deriving an FEC word from a row of sample entries which includes data bits and parity bits, and generating at least a one bit error syndrome by XORing the parity bits of the FEC word with parity bits derived from a look-up table using the FEC word data bits.

13. The method of claim 12, wherein the error syndrome further includes the error positions of 2 bits.

14. The method of claim 12, wherein the steps further include:

mapping each error syndrome into the sample table entries and summing the absolute values of the corresponding table entries to form a list of numbers.

15. The method of claim 14, wherein the steps further include:

determining the smallest number in the list and using it as the most likely error pattern, wherein the bits are flipped in the FEC word.

* * * * *